United States Patent
Seo

(10) Patent No.: US 7,298,766 B2
(45) Date of Patent: Nov. 20, 2007

(54) LASER DIODE DRIVER AND DRIVING METHOD FOR CONTROLLING AUTO LASER POWER, OPTICAL PICKUP DEVICE, AND OPTICAL RECORDING/REPRODUCING APPARATUS USING THE SAME

(75) Inventor: Jin-gyo Seo, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 606 days.

(21) Appl. No.: 10/320,672

(22) Filed: Dec. 17, 2002

(65) Prior Publication Data

US 2003/0185260 A1 Oct. 2, 2003

(30) Foreign Application Priority Data

Mar. 29, 2002 (KR) .............................. 2002-17410

(51) Int. Cl.
*H01S 3/13* (2006.01)

(52) U.S. Cl. ................ 372/29.01; 372/38.02; 372/38.07

(58) Field of Classification Search .............. 372/9, 372/25, 29.015, 29.014, 29.01, 38.02, 38.07; 369/53.1, 54
See application file for complete search history.

(56) References Cited

U.S. PATENT DOCUMENTS

| | | | | |
|---|---|---|---|---|
| 5,475,210 A | * | 12/1995 | Taguchi et al. | .............. 250/205 |
| 5,790,491 A | | 8/1998 | Jaquette et al. | |
| 5,854,702 A | * | 12/1998 | Ishikawa et al. | .............. 398/137 |
| 6,061,317 A | * | 5/2000 | Shodo | .................. 369/53.26 |

(Continued)

FOREIGN PATENT DOCUMENTS

| | | |
|---|---|---|
| CN | 135699.2 | 8/2001 |
| CN | 1307333 | 8/2001 |
| EP | 1 061 509 A2 | 12/2000 |
| EP | 1 091 353 | 4/2001 |
| EP | 1 091 353 A1 | 4/2001 |
| JP | 03-245327 | 10/1991 |
| JP | 07-262590 | 10/1995 |
| JP | 11-273076 | 10/1999 |
| JP | 2000-216470 | 8/2000 |

(Continued)

OTHER PUBLICATIONS

U.S. Appl. No. 09/515,516, filed Feb. 29, 2000, Jin-gyo Seo, Samsung Electronics Co., Ltd.

(Continued)

*Primary Examiner*—Dung (Michael) T. Nguyen
(74) *Attorney, Agent, or Firm*—Staas & Halsey LLP

(57) ABSTRACT

A laser diode driver, and driving method, for driving a laser diode in an optical recording/reproducing apparatus, having an auto laser power control (APC) operation, an optical pickup device, and an optical recording/reproducing apparatus, and method therefore, using the laser diode driver. The laser diode driver includes a multiplexer, a pulse generator, a differential amplifier, and an adder. The multiplexer selectively outputs drive potentials, such as a peak power drive potential, a bias power drive potential, a read power drive potential, and the like, corresponding to power levels of a laser signal, in response to a select signal applied to the multiplexer. The pulse generator generates the select signal applied to the multiplexer, the differential amplifier calculates a difference between a monitor signal provided from a monitor diode for monitoring the laser signal output from the laser diode and a drive potential selected by the multiplexer, the adder adds an output of the differential amplifier and an output of the multiplexer and outputs a signal for driving the laser diode, and the laser diode driver itself performs the APC function, thereby reducing the potential of laser diode driver malfunction caused by electromagnetic interference.

1 Claim, 9 Drawing Sheets

U.S. PATENT DOCUMENTS

| | | | |
|---|---|---|---|
| 6,115,338 A * | 9/2000 | Masaki et al. | 369/47.52 |
| 6,317,391 B1 | 11/2001 | Schell et al. | |
| 6,317,405 B1 | 11/2001 | Arai | |
| 6,327,229 B1 * | 12/2001 | Kawabe | 369/30.17 |
| 6,487,154 B1 | 11/2002 | Kurebayashi et al. | |
| 6,542,449 B2 * | 4/2003 | Nakatsuka et al. | 369/53.1 |
| 2001/0043534 A1 | 11/2001 | Gyo | |

FOREIGN PATENT DOCUMENTS

| | | |
|---|---|---|
| JP | 2000-339736 | 12/2000 |
| JP | 2001-229561 | 8/2001 |
| JP | 2001-297466 | 10/2001 |
| JP | 2002-42362 | 2/2002 |
| TW | 274157 | 4/1984 |

OTHER PUBLICATIONS

U.S. Appl. No. 09/816,109, filed Mar. 26, 2001, Jin-gyo Seo et al., Samsung Electronics Co., Ltd.

European Search Report for Application No. EP 02 25 6155.

European Search Report for Application No. EP 02256155.9.

Japanese Office Action mailed Oct. 2005 for Application No. 2003-086177.

European Search Report dated Mar. 3, 2006 for European App. No. 05076533.8.

Official Action issued by the Chinese Patent Office on Oct. 15, 2004 in a corresponding Chinese Application.

* cited by examiner

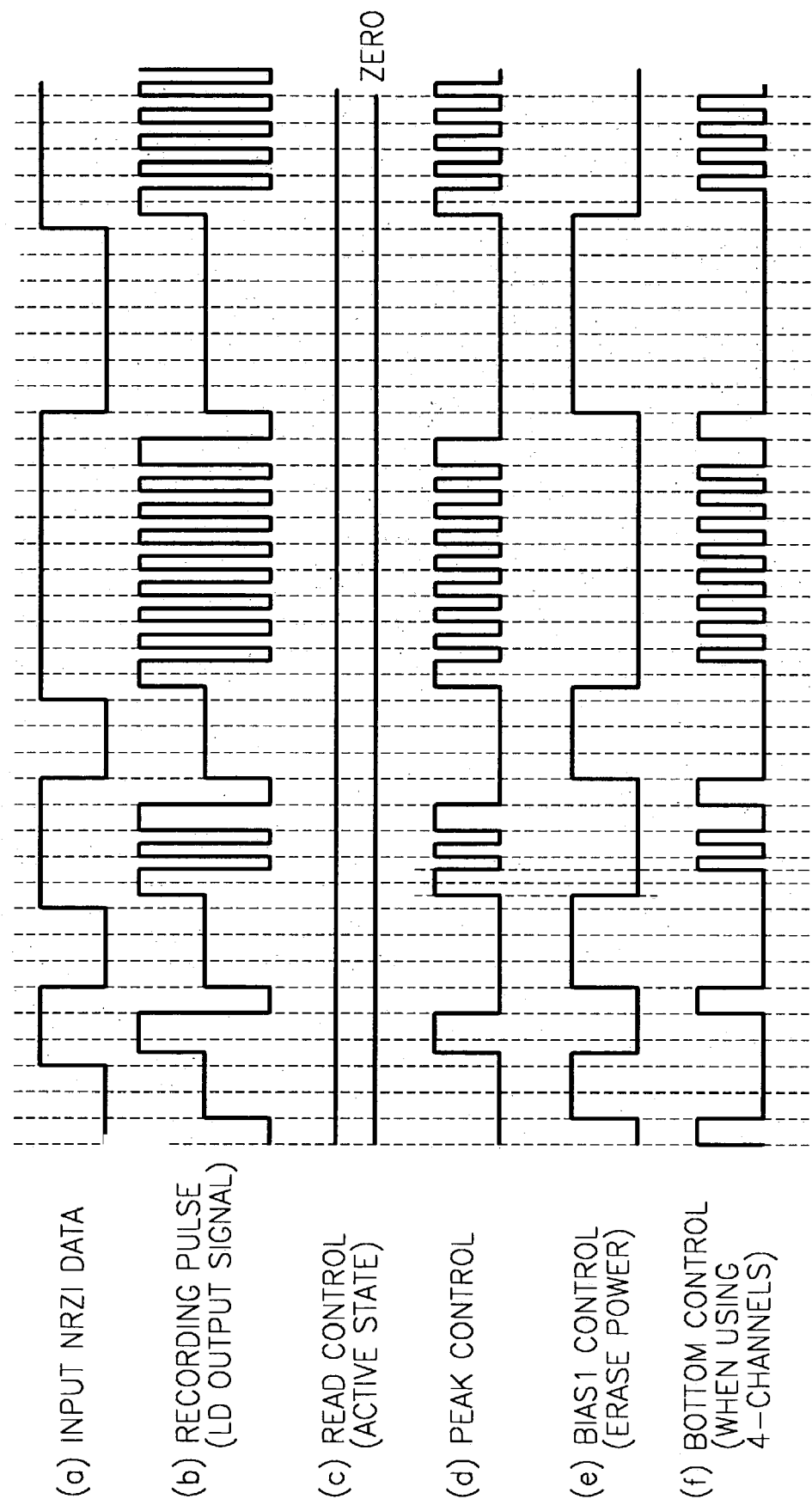

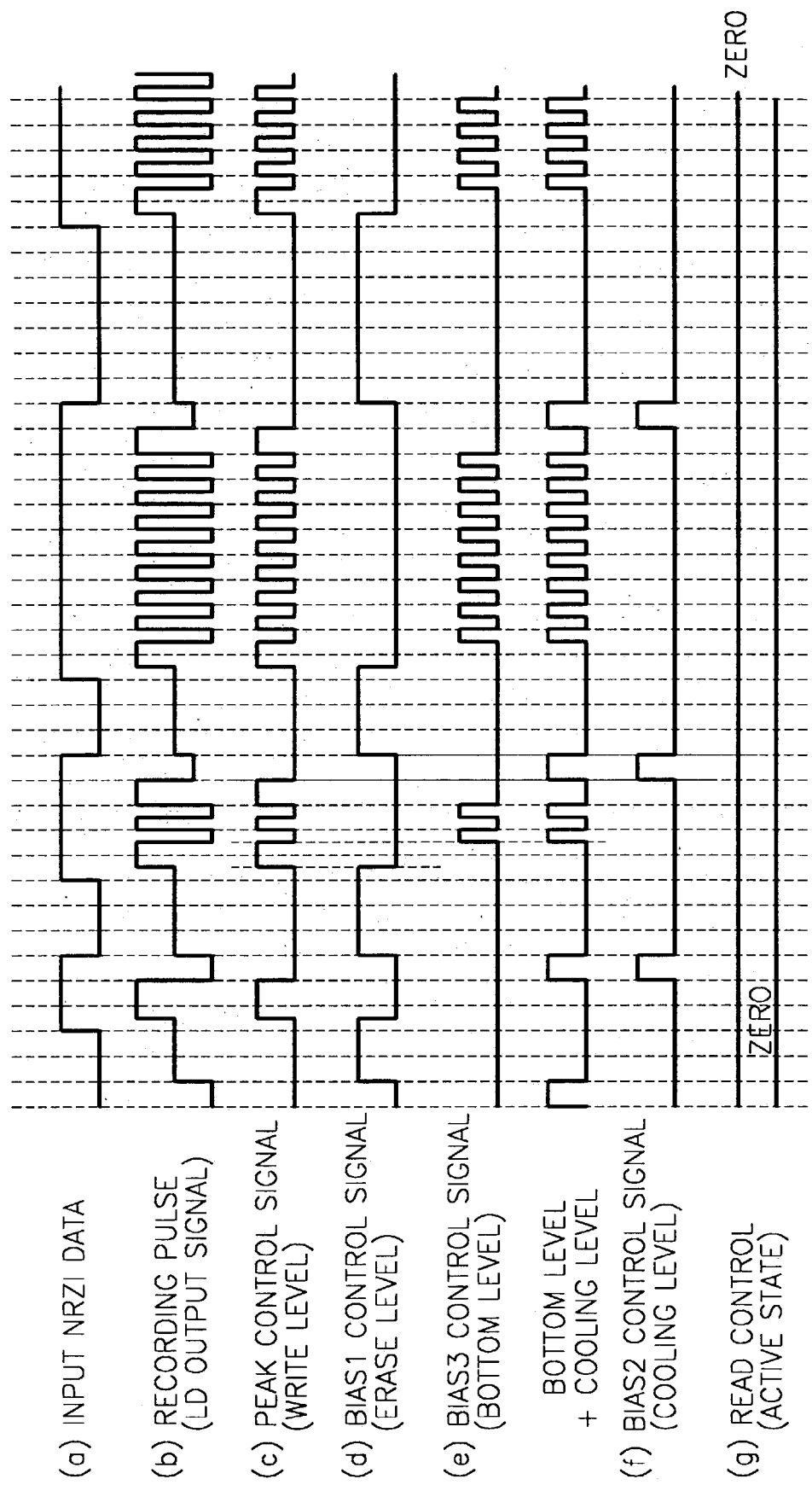

LASER DIODE DRIVER AND DRIVING METHOD FOR CONTROLLING AUTO LASER POWER, OPTICAL PICKUP DEVICE, AND OPTICAL RECORDING/REPRODUCING APPARATUS USING THE SAME

CROSS-REFERENCE TO RELATED APPLICATIONS

This application claims the benefit of Korean Patent Application No. 2002-17410 filed on Mar. 29, 2002, in the Korean Intellectual Property Office, the disclosure of which is incorporated herein by reference.

BACKGROUND OF THE INVENTION

1. Field of the Invention

The present invention relates to a laser diode driver and driving method for driving a laser diode in an optical recording/reproducing apparatus, and more particularly, to a driving of a laser diode driver performing auto laser power control (APC), an optical pickup device and an optical recording/reproducing apparatus and method using the same.

2. Description of the Related Art

In modern society, also called "The Information Age or Multimedia Age", recording media having high capacity, such as magneto-optical disk drives (MODDs), DVDs-RW, or DVDs-RAM, have become strongly relied upon. Optical recording/reproducing apparatuses use a laser diode (LD) to generate a laser signal for reading/writing information from/on optical recording media. The laser diode has input/output characteristics which sensitively change according to its operation temperature.

In other words, changing or using different inputs (generally represented as a value of currents) becomes necessary for outputting laser signals having the same power level corresponding to operation temperatures of the laser diode. Thus, an auto laser diode power (APC) control technique, which determines the general performance of the optical recording/reproducing apparatus, to control the laser diode to be in an optimal state, is required.

Further, optical recording apparatuses use storage media with high capacities and densities and perform recording/reproducing operations at a high-transfer rate. Thus, APC devices must be protected from potential noise and interference.

FIG. 1 is a block diagram of a laser diode driver 100 currently used in most optical recording/reproducing apparatuses. The laser diode driver 100 includes switches 10a through 10c, a multiplexer 12 for multiplexing powers of the switches 10a through 10c, an amplifier 14 for amplifying an output power from the multiplexer 12 with a predetermined amplification gain, an adder 16, and a high frequency modulator 18 (hereafter referred to as "HFM").

Currents, peak current, bias current, and read current, or voltages, hereinafter referred to as "drive potentials", corresponding to power levels of a laser diode (peak power level, bias or erase power levels, and read power level) are applied to the switches 10a through 10c, respectively. The drive potentials are turned on/off by a peak power control signal, a bias power control signal, and a read power control signal, respectively. For example, a peak drive potential necessary for generating the peak power level is turned on/off by the peak power control signal.

The output power signals of the switches 10a through 10c are multiplexed by the multiplexer 12. The output power signal of the multiplexer 12 finally becomes a laser diode drive signal LD DRIVER_OUT which has a waveform including a first pulse, a recording pulse, a multi-pulse, and a last pulse. The laser diode is then driven by the laser diode drive signal LD DRIVER_OUT to generate the recording pulse.

However, the laser diode cannot be fully driven by only the output power signal of the multiplexer 12. Thus, the output power signal of the multiplexer 12 has to be amplified by the amplifier 14.

The HFM 18 generates a high frequency modulation signal for removing light interfering noise from an optical detector (not shown). The high frequency modulation signal is added to the output power signal of the amplifier 14 by the adder 16. The laser diode is then driven by the output power signal of the adder 16. Here, the high frequency modulation signal is set to have the most effective frequency and amplification to remove potential light interfering noise. The high frequency modulation signal is mostly used in a read mode.

The laser diode driver shown in FIG. 1 may include 2-5 switches according to a number of used channels, i.e., 2-5 channels according to the number of power levels used in the recording pulse.

FIG. 2A is an illustration of a CD-RW recording pulse (a 3-channel example), and FIG. 2B is an illustration of a DVD-RAM recording pulse (a 5-channel example).

Referring to FIG. 2A, illustrated portion (a) represents input NRZI data, illustrated portion (b) represents a recording pulse for forming a predetermined recording mark, illustrated portion (c) represents a read control signal, illustrated portion (d) represents a peak control signal, illustrated portion (e) represents a bias1 control signal, and illustrated portion (f) represents a bottom control signal.

Referring to FIG. 2A, illustrated portion (a) similarly represents input NRZI data, illustrated portion (b) represents a recording pulse for forming a predetermined recording mark, illustrated portion (c) represents a peak control signal, illustrated portion (d) represents a bias1 control signal, illustrated portion (e) represents a bias3 control signal, illustrated portion (f) represents a bias2 control signal, and illustrated portion (g) represents a read control signal.

The control signals control the drive potentials so as to obtain the laser diode drive signal LD DRIVER_OUT having the same waveform as the recording pulse shown in illustrated portion (b) of FIGS. 2A and 2B, for example.

FIG. 3 is a graph illustrating characteristics of an example laser diode, i.e., input/output characteristics of TOLD9452MB made by TOSHIBA. In FIG. 3, it can be seen that the laser diode has input/output characteristics which change with a change of temperature. Typically, an operation temperature of a laser diode increases after a certain period of time while the laser diode is driven, whereby optical output power decreases corresponding to the input current. For example, when the input current is 110 mA, the optical output power may be 40 mW at an operation temperature of 25° C. However, the optical output power may be reduced to about 20 mW at an operation temperature of 70° C. Therefore, a failure to control the laser diode according to changes in the operation temperature causes malfunctions during recording/reading, and may even make recording/reading impossible.

One way of solving this problem is to use an APC device. The APC device feeds a change in the output power of the laser diode back to the laser diode, to uniformly maintain the output power of the laser diode.

However, in the prior art, the APC operation cannot be realized within the laser diode driver, but requires an additional circuit or IC. An APC device is generally installed on a Main PCB, with the laser diode driver being positioned in an optical pickup. The Main PCB may be connected to the pickup via a flexible printed circuit board (FPCB).

The APC device is supplied with a monitor signal mon-PD from a monitor photodiode (PD) attached to the laser diode via the FPCB. The laser diode driver also has to be supplied with control signals via the FPCB.

Since the monitor signal mon-PD is very small, e.g., of about several µA, it is highly sensitive to noise. The frequency of a control signal is very high, thereby causing electromagnetic interference (EMI) in peripheral devices. For high recording density, the wavelength of the laser signal has actually been shortened to 780 nm (in the case of compact disks), 635 nm, 650 nm (in the case of digital versatile disks), and 410 nm (in case of HD DVD using a blue laser). The recording/reproducing transfer rate is commonly up to 52×. As a result, the frequency of the control signal has increased. Thus, due to EMI, recording performance may be deteriorated and an accurate interface via the FPBC may be impossible.

When the recording/reproducing apparatus includes a plurality of laser diodes to maintain the compatibility between recording media, the recording/reproducing apparatus has to include additional circuits and parts, such as APC apparatuses, laser diode drivers, and the like, corresponding to the respective laser diodes. Thus, it has become difficult to reduce size, weight, and price of recording/reproducing apparatuses.

SUMMARY OF THE INVENTION

To solve the above-described problems, it is an aspect of the present invention to provide a laser diode driver and method for driving a laser diode driver, having an improved structure by which effects of noise and interferences are minimized, by using an APC operation such that a plurality of laser diodes can be driven.

It is another aspect of the present invention to provide an improved optical pickup device.

It is still another aspect of the present invention to provide an improved optical recording/reproducing apparatus.

Additional aspects and advantages of the present invention will be set forth in part in the description which follows and, in part, will be obvious from the description, or may be learned by practice of the invention.

Accordingly, to achieve the above and other aspects, an embodiment of the present invention provides a laser diode driver and driving method, with the driver including a multiplexer, a pulse generator, a differential amplifier, and an adder. The multiplexer selectively outputs drive potentials, such as a peak power drive potential, a bias power drive potential, a read power drive potential, and the like, corresponding to power levels of a laser signal and in response to a select signal applied to the multiplexer. The pulse generator generates the select signal applied to the multiplexer, the differential amplifier calculates a difference between a monitor signal provided from a monitor diode to monitor the laser signal output from the laser diode and a drive potential selected by the multiplexer, and the adder adds an output of the differential amplifier and an output of the multiplexer and outputs a signal for driving the laser diode.

To achieve the above and another aspect, an embodiment of the present invention provides an optical pickup device which moves across a data storage medium, the optical pickup including a laser diode and a laser diode driver. The laser diode generates a laser signal for recording/reproducing data on/from the data storage medium and the laser diode driver drives the laser diode and controls power of the laser diode according to changes in temperature.

To achieve the above and still other aspects, an embodiment of the present invention provides an optical recording/reproducing apparatus, and method for operation thereof, including an optical pickup, a first printed circuit board, a second printed circuit board, and a flexible printed circuit board. The optical pickup is mounted with a laser diode that generates a laser signal for recording/reproducing data on/from a data storage medium therein and moves across the data storage medium. The first printed circuit board includes a laser diode driver that is installed in the optical pickup and controls power of the laser diode according to changes in temperature. The second printed circuit board includes a controller for controlling the laser diode driver. The flexible printed circuit board interfaces signals between the first and second printed circuit boards.

BRIEF DESCRIPTION OF THE DRAWINGS

These and other aspects and advantages of the present invention will become apparent and more readily appreciated from the following description of the embodiments, taken in conjunction with the accompanying drawings of which:

FIGS. 2A and 2B include illustrated CD-RW recording pulses (portions (a)-(f)) and DVD-RAM recording pulses (portions (a)-(g)), respectively;

DETAILED DESCRIPTION OF THE PREFERRED EMBODIMENTS

Figure 1:
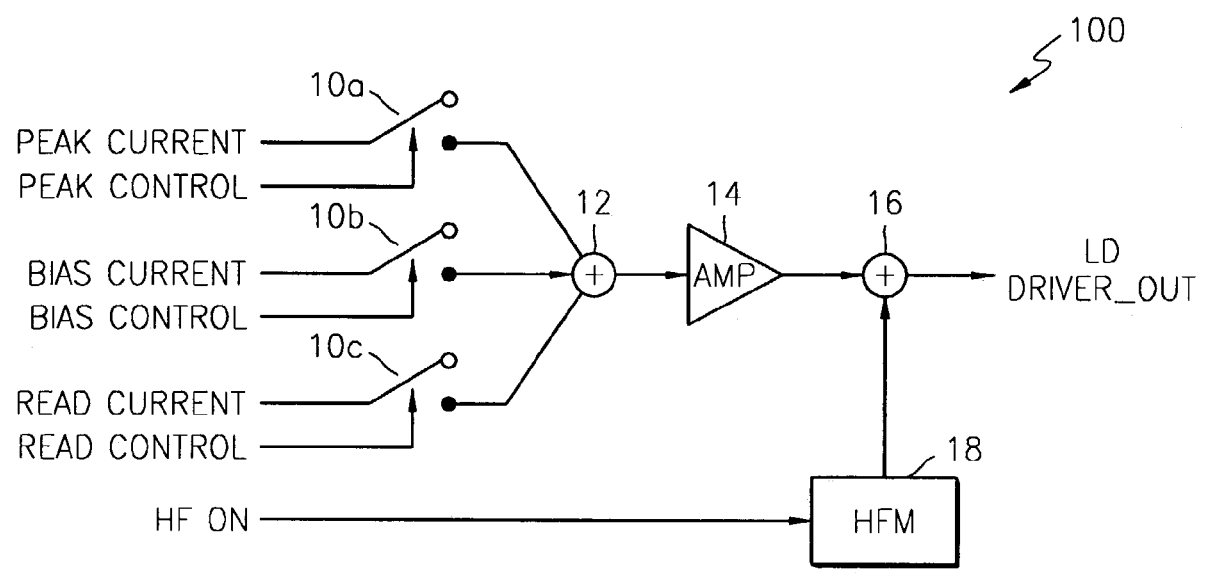
FIG. 1 is a block diagram of a conventional laser diode driver.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 4:
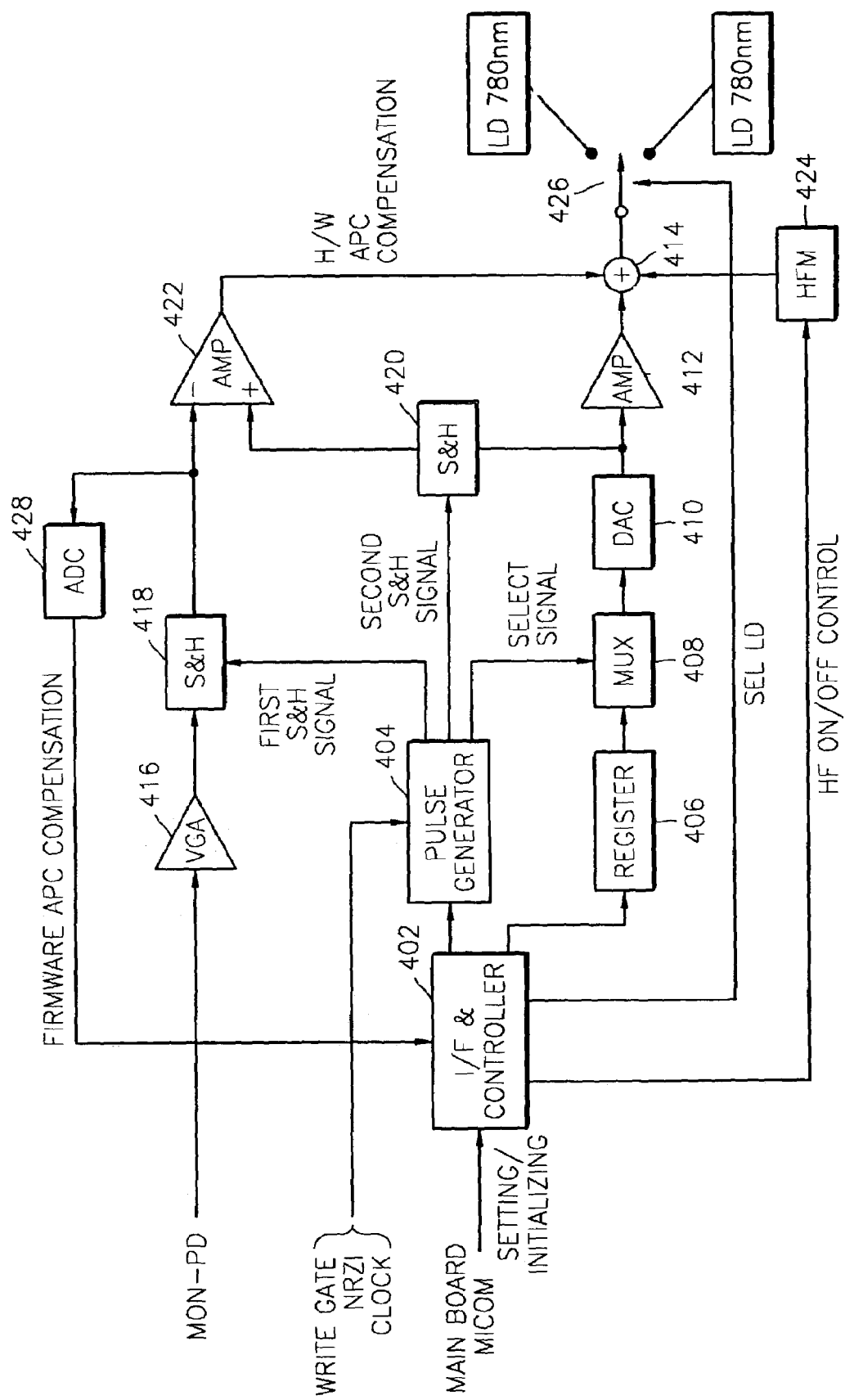
FIG. 4 is a block diagram of a laser diode driver according to an embodiment of the present invention.

FIG. 4 is a block diagram of a laser diode driver according to an embodiment of the present invention. The laser diode driver shown in FIG. 4 includes an interface (I/F) and controller 402, a pulse generator 404, a register 406, a multiplexer 408, a digital-to-analog converter (DAC) 410, an amplifier 412, an adder 414, a variable gain amplifier (VGA) 416, a first sample and hold (S & H) unit 418, a second sample and hold (S & H) unit 420, a differential amplifier 422, a high frequency modulator (HFM) 424, a laser driver select switch 426, and an analog-to-digital converter (ADC) 428.

The IF & controller 402 controls interface with a microprocessor (not shown) of a main board to initialize components of the laser diode driver. The microprocessor of the main board reads data recorded in a lead in/lead out sector of a disk, in an initialization operation, and provides it to the I/F & controller 402. The data provided may be by a disk manufacturer and include information on power levels suitable for the disk.

The pulse generator 404 generates channel control signals according to operation modes and generates a first sample & hold control signal for controlling the first S & H unit 418, a second sample & hold signal for controlling the second S & H unit 420, and a select signal for controlling the multiplexer 408.

A write gate (WG) signal, a Non Return to Zero Inverted (NRZI) signal, a clock signal, and the like are input to the pulse generator 404. The WG signal controls a read/write operation, with the NRZI signal being obtained according to NRZI-modulating data to be recorded on the optical disk.

The operating of the pulse generator 404 depends on operation modes (read/write, and the like) or APC modes (peak, average, and the like) and is controlled by the I/F & controller 402.

The register 406 stores drive potentials (a peak power drive potential, a bias power drive potential, a read power drive potential, and the like) corresponding to power levels of a laser signal. Values of the drive potentials are provided to the I/F & controller 402. In an initialization operation, the I/F & controller 402 sets drive potentials that will be stored in the register 406 with reference to a table that is provided by the microprocessor of the main board.

A difference between a power level of the laser diode and an actual power level is obtained by the differential amplifier 422. A compensation value for compensating for this difference, or "change," in the laser power is output from the differential amplifier 422 and is applied to the laser diode via the adder 414. As a result, an APC operation for controlling the power of the laser diode is performed. Here, the relationship between the changed value of the laser power and compensation value is determined by a gain of the differential amplifier 422.

The multiplexer 408 selects a drive potential from the drive potentials stored in the register 406. The selection operation of the multiplexer 408 is controlled by a select signal supplied from the pulse generator 404.

Each of the drive potentials stored in the register 406 may be respectively selected according to corresponding drive control signals. The selection operation can be performed by the multiplexer 408. The drive potentials are applied to the multiplexer 408 and control signals, as selection control signals, and are thereby applied to the multiplexer 408.

The pulse generator 404 determines operation modes by channel control signals (a peak control signal, a bias control signal, and a read control signal).

A mode of a recording/reproducing may be supplied with an additional mode signal from the main board. However, in this case, the laser diode must further include an input pin for inputting the mode signal. To solve this problem, an operation mode can be determined from the channel control signals.

For example, the peak control signal can be generated only in a recording mode, and thus the existence of a recording/reproducing mode can be confirmed depending on whether the peak control signal was generated.

A drive potential selected from the multiplexer 408 can be supplied to the adder 414 through the amplifier 412. The amplifier 412 can perform an operation corresponding to the operation of the amplifier 14 shown in FIG. 1.

A monitor signal mon-PD output from a monitor diode is amplified by a current/voltage (I/V) amplifier (not shown), with a predetermined amplification degree, and applied to the VGA 416. Hereinafter, a signal input to the VGA 416 is referred to as a "monitor signal mon-PD." The gain of the VGA 416 varies depending on operation modes and kinds of tracks (land/groove) being reproduced or recorded. The gain of the VGA 416 is controlled by the I/F & controller 402. As is generally known, a DVD can have at least two kinds of tracks, e.g., a land track and a groove track. Since the land and groove tracks have different light reflectivities, it is necessary to change the gain of the VGA 416 according to the kinds of tracks. Alternatively, it is possible to configure and set the VGA 416 to apply the same gain.

The first S & H unit 418 samples and holds a signal output from the VGA 416. The sampling & holding operation of the first S & H unit 418 is controlled by a first sample & hold control signal supplied from the pulse generator 404.

The monitor signal mon-PD is a laser signal output from the laser diode, and thus has the same waveform as the laser signal. The laser signal has the same waveform as the output of the multiplexer 408, i.e., a recording pulse. Thus, the monitor signal mon-PD has almost the same waveform as the output of the multiplexer 408 due to the HFM 424, except that the monitor signal mon-PD is delayed. Also, since the monitor signal mon-PD is the laser signal output from the laser diode, the monitor signal mon-PD may have the same waveform as the laser signal, but may be out of phase with the laser signal.

The recording pulse output from the multiplexer 408 corresponds to a combination of control signals. Thus, the first sample & hold signal for controlling the first S & H unit 418 can be generated by combining and delaying the control signal.

In other words, the first sample & hold signal for determining the sampling intervals required for sampling power levels can be generated by combining the control signals.

The second S & H unit 420 samples and holds the output of the DAC 410. The sampling & holding operation of the second S & H 420 is controlled by a second S & H control signal supplied from the pulse generator 404. The second S & H unit 420 samples outputs of the multiplexer 408, i.e., drive potentials.

The first and second S & H signals output from the first and second S & H units 418 and 420, respectively, are applied to the differential amplifier 422. The differential amplifier 422 detects a difference between the first and second S & H signals, i.e., a change in the laser output, and amplifies it with a predetermined amplification gain. The gain of the differential amplifier 422 is determined by the relationship between the change in the output laser signal and a compensation value corresponding to the change.

Figure 5:
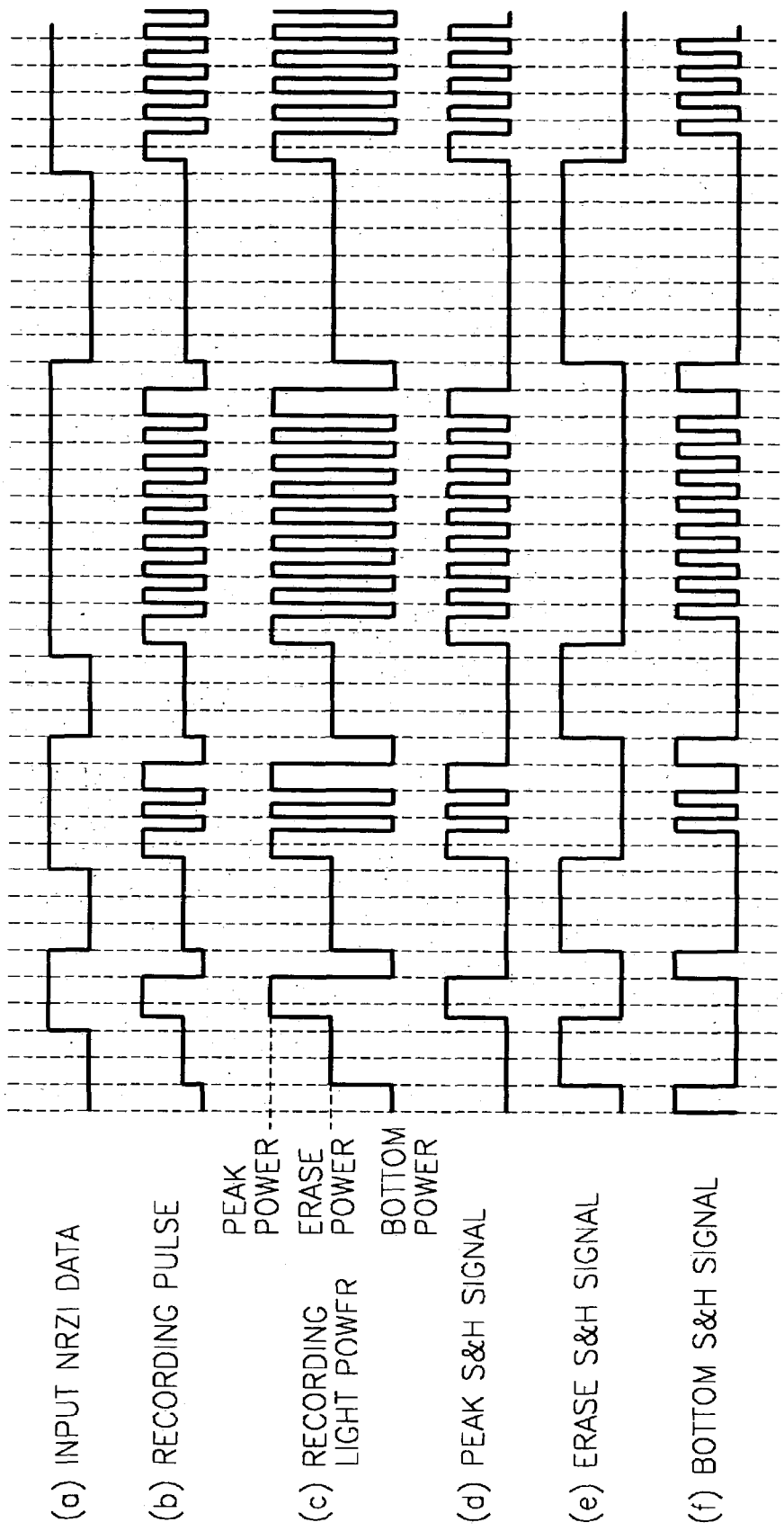
FIG. 5 includes illustrated recording pulses (portions (a)-(f)) of an optical recording apparatus according to an embodiment of the present invention.

Delay times and pulse widths of S & H signals, illustrated in portions (d), (e), and (f) of FIG. 5, may vary in accordance with the characteristics of the monitor signal mon-PD, i.e., delay time and attenuation.

The compensation value for compensating for a change value in output of the differential amplifier 422, i.e., output of the laser diode, is applied to the adder 414. The adder 414 adds a drive potential applied to an output laser diode of the amplifier 412 and output of the differential amplifier 422, i.e., the compensation value.

The output of the adder 414 is applied to the laser diode so as to output a laser signal having a desired power level.

A laser diode select switch 426 selectively supplies the output of the adder 414 to a first laser diode (e.g., a laser diode for generating a laser signal having a wavelength of 780 nm suitable for CDs) or a second laser diode (e.g., a laser diode for generating a laser diode having a wavelength of 650 nm suitable for DVDs). The selecting operation of the laser diode select switch 426 is controlled by a laser diode select signal sel-LD provided from the I/F & controller 402.

The HFM 424, which is similar to the HFM 18 shown in FIG. 1, generates a high frequency modulation signal for removing light interference noise from a light detector (not shown). The high frequency modulation signal is applied to the adder 414.

The operations of the first and second S & H units 418 and 420 shown in FIG. 4 will now be described in more detail.

The register 406 stores current values (peak current, bias current, and read current) corresponding to power levels (a peak power level, a bias (or erase) power level, and a read power level) of a laser diode to be used with the laser diode driver.

A microprocessor (not shown) of a main board reads a table (storing power levels required for each recording medium) that may be recorded in a lead in/lead out sector of a disk in an initialization operation and provides the read data to the I/F & controller 402. Then, the I/F & controller 402 sets current values suitable for the power levels in the register 406.

Figure 3:
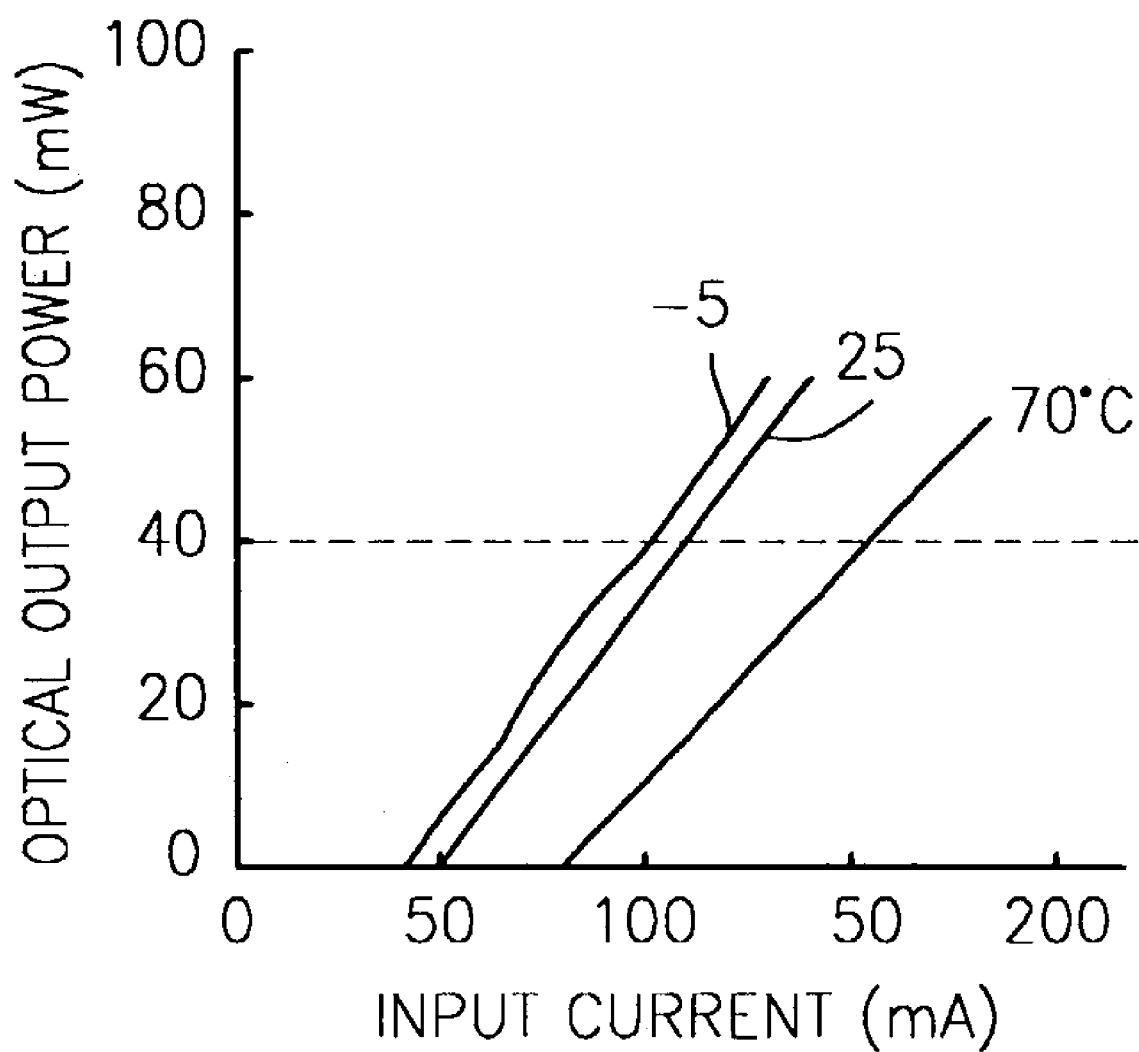
FIG. 3 is a graph illustrating temperature dependent characteristics of a laser diode.

In FIG. 3, it can be seen that the laser diode has input/output characteristics which depend on temperature. In other words, an output level of the laser signal is reduced with an increase in an operation temperature of the laser diode due to an increase in the temperature of the laser diode itself, which can even be caused by external ambient temperature changes. The change in the light output according to the change in temperature is compensated in a closed loop of a monitor diode (not shown), the VGA 416, the first and second S & H units 418 and 420, the differential amplifier 422, the adder 414, and the laser diode.

In other words, the output level of the laser diode can be detected via the monitor diode. The monitor signal mon-PD output from the monitor diode is variably amplified by the VGA 416 and sampled & held by the first S & H unit 418. Here, an amplification gain of the VGA 416 is determined based on an operation mode.

The first S & H unit 418 samples & holds a peak power level, a read power level, or an erase power level.

The second S & H unit 420 samples & holds a bias or a read current based on an operation mode. The differential amplifier 422 obtains a difference between outputs of the first and second S & H units 418 and 420.

The pulse generator 404 generates channel control signals based on the operation mode and supplies the first S & H control signal for controlling the first S & H 418, the second S & H control signal for controlling the second S & H 420, and the select signal for controlling the multiplexer 408.

The operation of generating the control signals in the pulse generator 404 is disclosed in detail in Korea Patent Application No. 99-20485, filed on Jun. 4, 1999, (inventor: Jin-kyo Seo, Title of the Invention: Method of Generating Recording Pulse Suitable for Various Types of Recording Media and Recording Apparatus Suitable for the same). According to Korea Patent Application No. 99-20485, control signals can be generated through the following operations: (a) establishing coefficients for the starting and ending portions of a first pulse, a multi-pulse string, a last pulse, and a cooling pulse constituting a recording pulse, according to kinds of optical recording media and based on rising and falling edges of a recording mark; (b) storing coefficients obtained in operation (a); and (c) generating a peak power control signal, a bias power control signal, and a read power control signal being in synchronization with an input NRZI signal, with reference to coefficients of each optical recording medium. The content of Korea Patent Application No. 99-20485 is incorporated herein by reference.

A method of generating sample & hold control signals using the control signals is disclosed in Korea Patent Application No. 01-6979, filed on Feb. 14, 2001, (Inventor: Jin-kyo Seo, Title of the Invention: Method of Initializing Laser Diode Driver and Recording/Reproducing Apparatus Suitable for the same, and Method of Driving Laser Diode Driver. According to Korea Patent Application No. 01-6979, a recording pulse can be generated by combining the control signals. Also, sample & hold control signals for sampling a peak power level, a read power level, an erase power level, and the like can be generated by combining the control signals. Further, operation modes can be identified using the control signals. The content of Korea Patent Application No.01-6979 is incorporated herein by reference.

Table 1, below, shows operations of identifying modes in the pulse generator 404.

TABLE 1

| read control | erase control | peak control | mode | REMARKS |
|---|---|---|---|---|
| 0 | X | X | disable | LD Driver disable |
| 1 | 0 | 0 | reproducing | HFM on |
| 1 | 1 | 0 | erasing | HFM on/off |
| 1 | 0 | q | recording | HFM on/off |
| 1 | 1 | q | recording | HFM off |

As shown in Table 1, the pulse generator 404 identifies recording and erasing modes if any one of an erase control signal and a recording control signal is active (i.e., a "1" in Table 1), and identifies a reproducing mode in the opposite case.

If a read control signal is not active, the pulse generator 404 identifies a disable mode where the laser diode must not be driven.

As shown in Table 1, operation modes are identified in the pulse generator 404, and operations of the VGA 416, the first and second S & H units 418 and 420, and the multiplexer 408 are controlled according to the operation modes.

In a read mode, a read gain is set in the VGA 418, the first S & H unit 418 samples & holds the read power level from the output of the VGA 416, and the second S & H unit 420 samples & holds the read current.

In write and erase modes, a write gain is set in the VGA 416, the first S & H 418 samples & holds the peak power level from the output of the VGA 416, and the second S & H 420 samples & holds the bias current (or erase current).

Table 2 shows sampling operations of the first S & H unit 418.

TABLE 2

| | Sampling level or sector | Remarks |
|---|---|---|
| sampling type1 | Pulse having Peak level | Peak = first + last + multi |
| sampling type2 | First pulse | Having peak level and widest sector |
| sampling type4 | Last pulse | |
| sampling type4 | Multi of non-multi pulse | CD-R is a non-multi type. |
| sampling type5 | Erase(bias1) level | Erase is identical to bias1. |
| sampling type6 | Cooling(bias2) level | Cooling is identical to bias2. |
| sampling type7 | Bottom(bias3) level | Bottom is identical to bias3. |
| sampling type8 | Average | Average level using LPF |
| sampling type9 | A portion of mark sector | A portion of peak or multi |
| sampling type10 | Combination of above levels or sectors | A combination of above nine levels or sectors is used. |

FIG. 5 illustrates waveforms of the first sample & hold control signal for controlling the first S & H unit 418. Referring to FIG. 5, illustrated portion (a) represents input NRZI data, illustrated portion (b) represents a recording pulse for forming a predetermined recording mark, illustrated portion (c) represents a peak control signal, illustrated portion (d) represents a bias1 control signal, illustrated portion (e) represents a bias3 control signal, illustrated portion (f) represents a bias2 control signal, and illustrated portion (g) represents a read control signal.

The recording pulse (portion (b)) is formed based on the Non Return to Zero Inverted (NRZI) signal (portion (a)). In an adaptive recording method, a starting/ending position, a pulse width, a power level, and the like of each pulse making up the recording pulse are changed according to the relationship between spaces (between marks) before and after a current mark (where a domain is formed in a track by a laser signal).

When generating the recording pulse, the pulse-generator 404 first generates control signals for controlling ON/OFF of the power levels, i.e., the read power control signal, the peak power control signal, the erase (or bias1) power control signal, a cooling (or bias2) power control signal, and a bottom (or bias3) power control signal. Next, the pulse generator 404 generates the first and second sample & hold control signals and the select signal by delaying and logically combining the control signals. Here, the appropriate generated power level control signals depends on the type of media.

The select signal controls the multiplexer 408 so that the drive potentials necessary for generating the recording pulse are sequentially obtained from the register 406.

The read power level, the peak power level, the bias1 power level, the bias2 power level, and the bias3 power level of the recording pulse are sequentially arranged in a predetermined order on the time axis, based on lengths of a recording medium and a mark thereon. Regions of the read power level, the peak power level, the bias1 power level, the bias2 power level, and the bias3 power level are represented by the read power control signal, the peak power control signal, the bias1 power control signal, the bias2 control signal, and the bias3 control signal, respectively.

Accordingly, periods of applying or controlling the power levels can be identified by combining the control signals. The pulse generator 404 generates a first sampling control signal representing points of time when the power levels are sampled from the output of the laser diode and the second sample & hold signal representing instants of time when reference power levels, for comparison with a signal sampled by the first S & H unit 418, will be sampled.

As noted above, I/F & controller 402 controls blocks shown in FIG. 4 according to operation modes and APC modes. The APC modes of the apparatus shown in FIG. 4 are an average APC mode, a direct APC mode, and the like.

The average APC mode performs an APC control using an average value of previous and current output values of the laser diode. The direct APC mode performs an APC control using the current output value of the laser diode.

The apparatus shown in FIG. 4 may be configured as a single integrated circuit, and thus may be mounted in the optical pickup. Also, external disturbances, that may interpose when interfacing between components, can be prevented so as to realize an operation of stably controlling the laser power. In particular, in an optical recording/reproducing apparatus with the capability of recording/reading in large capacities and at a high speed, signals transmitting and receiving between components may have high frequencies. Due to this, the optical recording/reproducing apparatus is sensitive to external disturbances, and thus may malfunction.

Operation of the apparatus and methodology, shown in FIG. 4, in each mode will now be described in more detail.

1. Initialization Mode

The microprocessor of the main board can detect a type of disk inserted into a corresponding recording/reproducing apparatus. An initialization operation is then performed to be suitable for a detected medium. In other words, an appropriate laser diode for recording/reading is selected through the sel_LD signal, and a table recorded in a lead in/lead out sector of the inserted medium may be read and corresponding data provided to I/F & controller 402. Laser diode lower levels are different according to the type of disk. Manufacturers of disks typically record tables having power levels suitable for the disks in lead in/lead out sectors. The I/F & controller 402 sets drive potentials that will be stored in the register 406, with reference to the table values.

A laser diode test mode can be performed, in this initialization operation. The laser diode test mode outputs read, erase, and peak powers at predetermined time intervals, monitors them to compensate for the drive potentials, and tests whether the laser diode is operating improperly. Even though the laser diode test mode is used to test the laser diode in the initialization operation, the laser diode test may be selectively performed at other times.

Testing of the laser diode may affect data recorded in the recording medium. Thus, to protect recorded data, the optical pickup can be moved to the innermost circumference or the outermost circumference of the medium or an objective lens can be moved up or down, at its maximum, via a focus servo in the laser diode. The time required for testing the laser diode can be minimized by moving the objective lens up/down at its maximum rather than moving the optical pickup to the innermost/outermost circumference.

2. Read Mode

A read drive potential is stored in the register 406, during the initialization operation of the I/F & controller 402. A read power level of the laser diode is then determined by the read drive potential stored in the register 406.

The first S & H unit 418 samples & holds the read power level from the monitor signal mon-PD. A sector having the read power corresponds to a sector where the read control signal is active.

The read power level sampled & held by the first S & H unit 418 is provided to a converting input port of the differential amplifier 422.

The second S & H unit 420 samples & holds the read drive potential applied to the laser diode. The read drive potential sampled & held by the second S & H unit 420 is provided to a non-converting input port of the differential amplifier 422.

The differential amplifier 422 detects a difference value between the read power level, sampled from the monitor signal mon-PD, and read drive potential applied to the laser diode. The difference value may be the result of a change in an operation temperature of the laser diode.

The difference value is converted to a compensation value by the gain of the differential amplifier 422. The compensation value is then provided to the adder 414. The compensation value, which compensates for the read drive potential set by the register 408, i.e., the drive potential which compensates for error components according to the change in the operation temperature of the laser diode, is output from the adder 414.

3) Erase Mode

An erase drive potential is stored in the register 406, during the initialization operation of the I/F & controller 402. The erase power level of the laser diode is then determined by the erase drive potential stored in the register 402.

The first S & H unit 418 samples & holds the erase power level from the monitor signal mon-PD. An erase power sector corresponds to a sector where the erase control signal is active.

The erase power level sampled & held by the first S & H unit 418 is provided to the converting input port of the differential amplifier 422.

The second S & H unit 420 samples & holds an erase drive potential applied to the laser diode. The erase drive potential sampled & held by the second S & H 420 is provided to the non-converting input port of the differential amplifier 422.

The differential amplifier 422 detects a difference value between the erase power level, sampled from the monitor signal mon-PD, and the erase drive potential applied to the laser diode. The difference value may be the result of the change in the operation temperature of the laser diode.

The difference value is converted to a compensation value by the gain of the differential amplifier 422. The compensation value is then provided to the adder 414. Thus, the adder 414 outputs the compensation value which has compensated for the erase drive potential set by the register 406, i.e., the compensated erase drive potential compensates for error components according to the change in the operation temperature of the laser diode.

4) Recording Mode

A peak power level is stored in the register 406, during the initialization operation I/F & controller 402. The first peak power level of the laser diode is then determined by a peak drive potential stored in the register 406.

The first S & H unit 418 samples & holds the peak power level from the monitor signal mon-PD. A peak power sector corresponds to a sector where a peak control signal is active.

The peak power level sampled & held by the first S & H unit 418 is provided to the converting input port of the differential amplifier 422.

The second S & H unit 420 samples & holds the peak drive potential applied to the laser diode. The peak drive potential sampled & held by the second S & H unit 420 is then provided to the non-converting input port of the differential amplifier 422.

The differential amplifier 422 detects a difference value between the peak power level, sampled from the monitor signal mon-PD, and the peak drive potential applied to the laser diode. The difference value may be the result of the change in the operation temperature of the laser diode.

The difference value is converted to a compensation value by the gain of the differential amplifier 422. The compensation value is then provided to the adder 414. Thus, the adder 414 outputs the compensation value which compensates for the peak drive potential set by the register 406, i.e., the compensated peak drive potential compensates for error components according to the change in the operation temperature of the laser diode.

The laser diode select switch 426 selects a laser diode to be used based on the laser diode select signal sel-LD. For example, the laser diode select switch 426 can select a CD-based laser diode having a wavelength of 780 nm or a DVD-based laser diode having a wavelength of 650 nm. The selection of the laser diode is performed when initializing the recording/reproducing apparatus. The HFM 424 generates high frequency modulation signals having different frequencies and sizes according to the kinds of a laser diode to be used.

5) Firmware APC Operation

The firmware APC operation, which is opposite to a hardware APC operation of the differential amplifier 422, performs a software APC operation without using the differential amplifier 422. A power level to be controlled is sampled by the first S & H unit 418 and compared with a corresponding drive potential stored in the register 406. The corresponding drive potential stored in the register 406 is changed according to the compared result.

The comparison operation may be performed directly in the I/F & controller 402 or may be performed using an external microprocessor or a digital signal processor (DSP).

The ADC 428 is provided for the firmware APC operation. The ADC 428 converts a value sampled & held by the first S & H unit 418 to a digital value.

Figure 6:
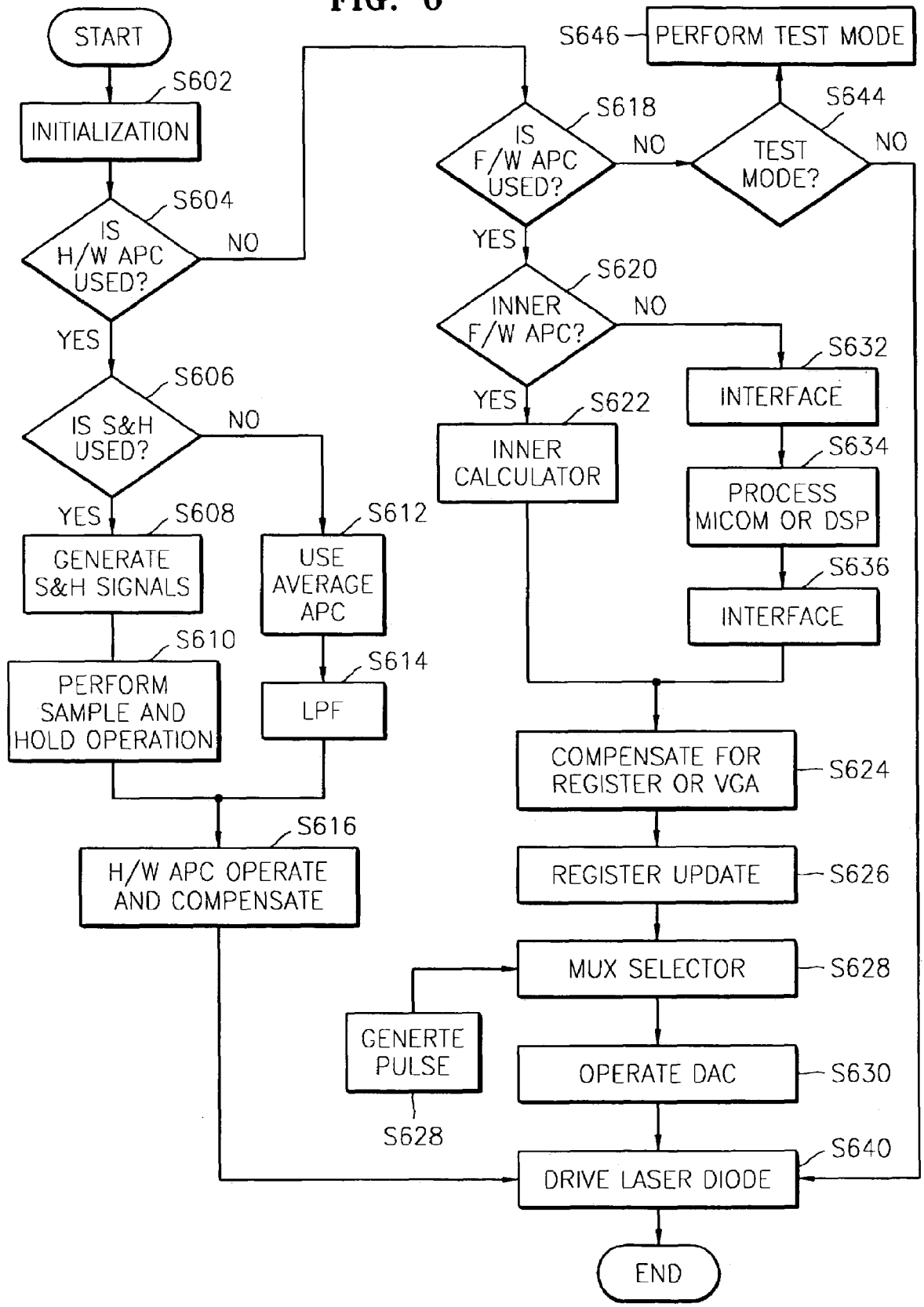
FIG. 6 is a flowchart illustrating an operation of the laser diode driver shown in FIG. 4.

FIG. 6 is a flowchart illustrating operations of the laser diode driver and driving methodology described in FIG. 4.

An initialization operation is performed, in operation S602. In the initialization mode, an inserted disk type is identified. A laser diode to be used and drive potentials suitable therefor are set based on the identified result.

It is then determined whether a hardware APC operation is performed, in operation 604, while, as noted above, the hardware APC operation is performed using the differential amplifier 422.

If it is determined that the hardware APC operation is performed, it is determined, in operation 606 whether a direct APC mode or an AVERAGE APC mode should be used. The direct APC mode uses a value sampled & held by the first S & H unit 418. The AVERAGE APC mode uses values averaged after the first S & H unit 418.

If it is determined that the direct APC mode is used, sample & hold control signals for controlling the first and second S & H units 418 and 420 are generated, in operation 608. A sample & hold operation is then performed, in operation 610, based on the sample & hold control signals.

However, if it is determined that the AVERAGE APC mode is used, the sampled & held values are averaged, in operation 612. Since the hardware APC operation is performed, the averaged value is obtained by a low-pass filter which low-pass filters the sampled & held values, in operation 614.

A laser diode power level can then be compensated for, in operation 616. Here, the differential amplifier 422 and the adder 414 are involved in the compensation of the operation of the laser diode power level.

If it is determined the hardware APC operation is not performed, it is determined in operation 618 whether the firmware APC operation should be performed. However, if it is determined that the firmware APC operation is performed, it is determined in operation 620 whether an inner firmware APC mode or an outer firmware APC should be performed. Here, the inner firmware APC mode represents a software APC operation of the I/F & controller 402, and the outer firmware APC mode represents a software APC operation using the external microprocessor or the DSP.

If it is determined that the inner firmware APC mode is used, an APC operation is performed by the I/F & controller 402. In other words, a power level to be controlled by the first S & H unit 418 is sampled, the power level is set by the ADC 428, a change value and a compensation value of laser power is calculated, and a drive potential stored in the register 408 is changed based on the change value and the compensation value, in operations 622 through 630.

The laser diode is then driven by the changed drive potentials, in operation 640.

In detail, a power level sampled by the first S & H unit 418 is compared with the drive potential stored in the register 408 in the I/F & controller 402 to calculate a change value, in operation 622. A new drive potential is obtained in consideration of the change value, in operation 624. The drive potential stored in the register 406 is updated using the compensated drive potential, in operation 626. The drive potential stored in the register 406 drives the laser diode through a multiplexing operation of the multiplexer 408 and a DAC operation of the DAC 410. A select signal necessary for the multiplexing operation is then generated in the pulse generator 404, in operation 642.

If it is determined that the outer firmware APC mode is used, the sampled power level is transmitted to the external microprocessor through an interfacing operation, in operation 632. The sampled power level is compared with a current drive potential, i.e., a drive potential stored in the register 406, in the external microprocessor to calculate a change value, in operation 634. The comparison result is then transmitted through the interfacing operation, in operation 636. Alternatively, instead of the external microprocessor, the DSP may be used.

The drive potential stored in the register 406 can be changed, as in the inner firmware APC operations 622 through 630. The laser diode is then driven by the changed drive potentials in step 640.

If it is determined that the firmware APC operation should not be performed, it is determined in operation 644 whether a laser diode test mode should be implemented, and if yes, the laser diode test mode is then performed.

The hardware APC and firmware APC operations may be complementary to each other in the apparatus shown in FIG. 4. When only the hardware APC operation is performed, a compensation value may be too great to be processed by the differential amplifier 422. In other words, a change value of the laser power deviates from the operational range of the differential amplifier 422, and thus the laser diode may not properly be controlled. During a high-transfer rate, it is preferable to increase the number of control loops to make a compensation value as small as possible. For this, it is necessary to periodically update the drive potential stored in the register 406. Thus, the firmware APC operation is periodically performed to reduce load in the hardware APC and increase the number of control loops.

Figure 7A:
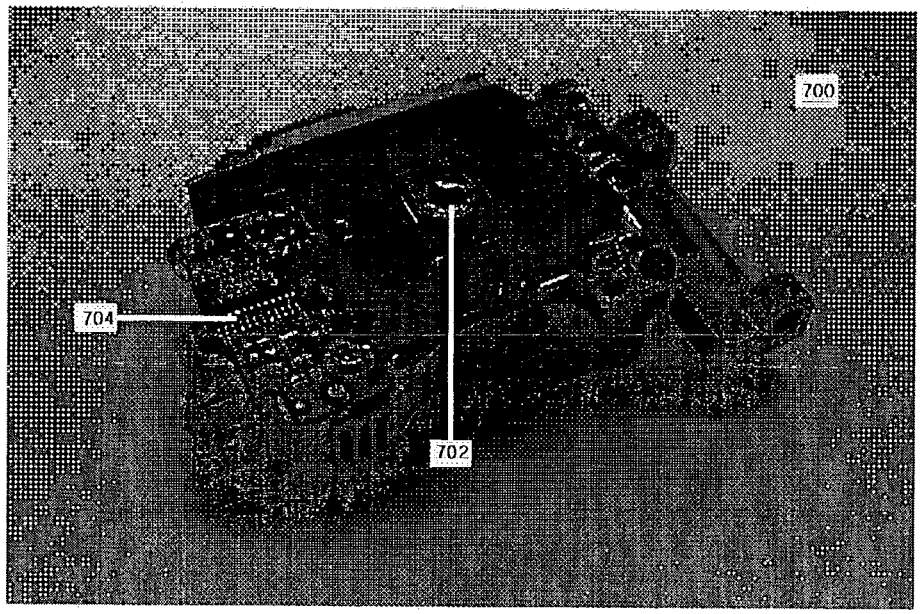
FIGS. 7A and 7B are illustrated front views of an optical pickup device having a laser diode driver, according to an embodiment of the present invention, and a FPCB, respectively.
Figure 7B:
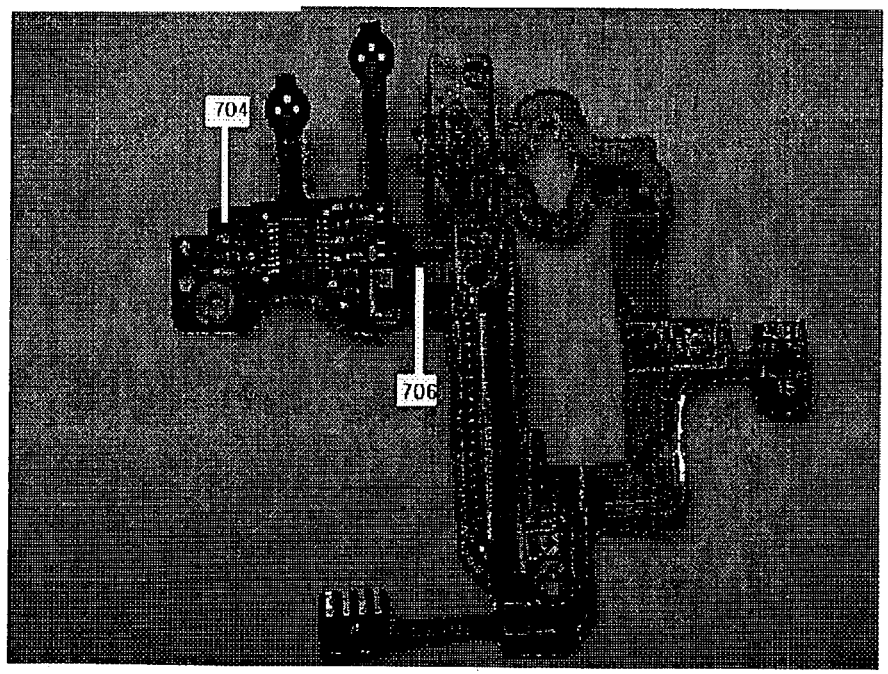

FIGS. 7A and 7B are illustrated front views of an optical pickup device having a laser diode driver and a FPCB, respectively, according to an embodiment of the present invention. As shown in FIG. 7A, an optical pickup 700 includes several parts, such as an objective lens 702, a laser diode (not shown), a laser diode driver (not shown), and a tilt sensor (not shown), etc. The laser diode driver is installed on a first printed circuit board (PCB) 704.

The optical pickup 700 moves so as to move across an optical disk, and the laser diode generates a laser signal for recording/reproducing data on the disk.

In FIG. 7B, a FPCB 706 for connecting the parts making up the optical pickup 700 to the first PCB 704 is provided. An end of the FPCB 706 is placed on a mold of the optical pickup 700 and fixed on the optical pickup by a screw, for example.

A flexible stacked PCB having one to four steps may be used.

Figure 8A:
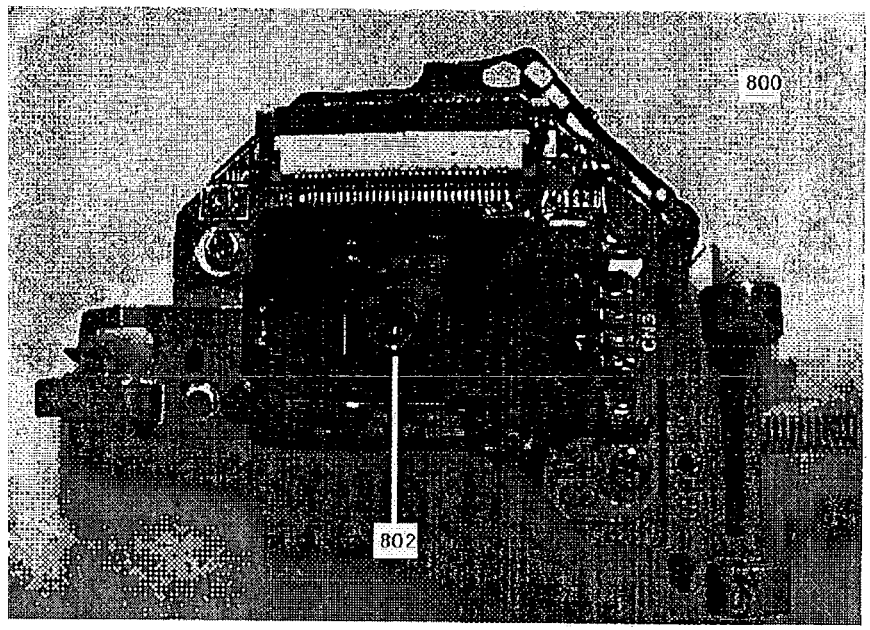
FIGS. 8A and 8B are illustrated front views of an optical pickup having a laser diode driver, according to another embodiment of the present invention, and a FPCB, respectively.
Figure 8B:
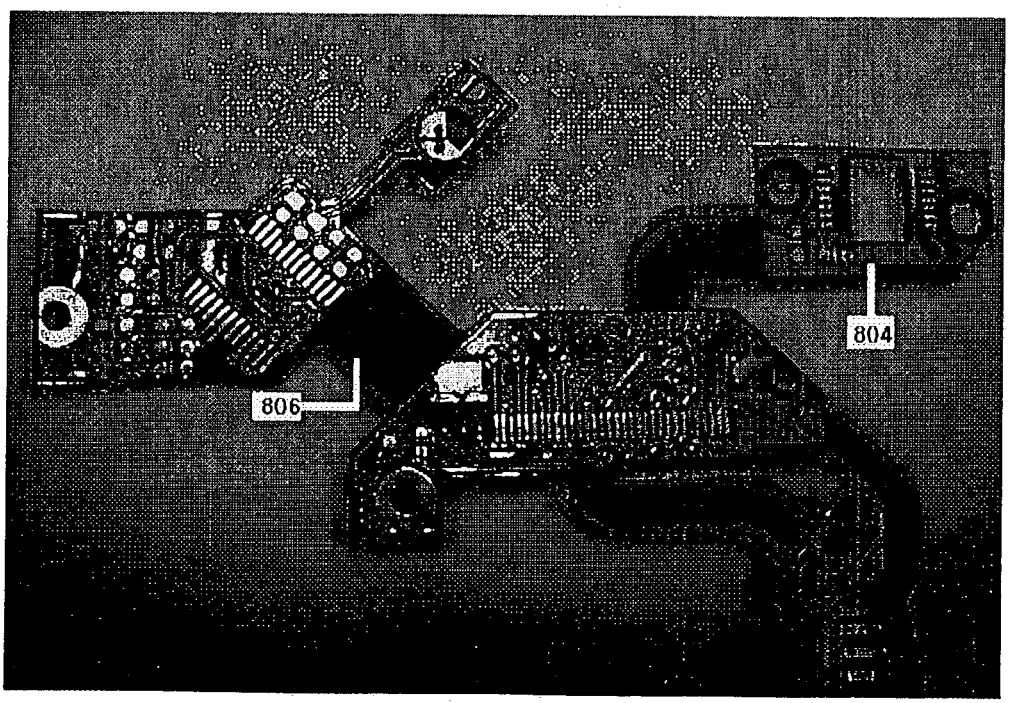

FIGS. 8A and 8B are illustrated front views of the pickup having a laser diode driver and a FPCB, respectively, according to another embodiment of the present invention. As shown in FIG. 8A, a pickup 800 may include several parts, such as an objective lens 802, a laser diode (not shown), a laser diode driver (not shown), and a tilt sensor (not shown), etc. The laser diode driver is installed on the first PCB 804.

In FIG. 8B, FPCB 806 is fixed on a mold of the optical pickup, and thus the shape of the FPCB is generally different according to the optical pickup model.

The other end of the FPCB 806 is connected to a main board (not shown) corresponding to a second PCB. For the connection to the main board, both the FPCB 806 and the main board have connectors. Alternatively, only the main board has a connector.

In conventional systems, an APC apparatus would be positioned on a main PCB, a laser diode positioned in an optical pickup, and the main PCB connected to a FPCB. In other words, in a conventional optical recording/reading apparatus, an APC apparatus is installed on a main PCB which is separated from an optical pickup device and supplied with a monitor signal mon-PD from a monitor photodiode (PD) attached to a laser diode via a FPCB. A laser diode driver must also be supplied with control signals via the FPCB.

The monitor signal mon-PD is small, i.e., of about several μA, and thus sensitive to noise. Also, frequencies of the control signal are very high, and thus cause electromagnetic interference (EMI) in peripheral devices. The frequencies of the control signals increase with an increase in recording/reproducing speed.

As a result, in the conventional optical recording/reproducing apparatus, it may be impossible to interface the monitor signal mon-PD or the control signals by the FPCB.

In an optical recording/reproducing apparatus according to an embodiment of the present invention, a laser diode performs an APC function and is installed in an optical pickup. Thus, problems occurring in a conventional optical recording/reproducing medium can be solved.

As described above, the laser diode driver itself, according to an embodiment of the present invention, performs the APC function, and thus can prevent malfunctions caused by electromagnetic interference.

Also, since one laser diode driver can drive a plurality of laser drivers, a recording/reproducing apparatus having a laser diode according an embodiment of the present invention would be downward compatible.

Further, since the laser diode driver performs hardware and software APC operations, respectively or complementarily, and the laser diode driver can properly cope with high-transfer rate recording/reproducing.

Lastly, in an optical recording/reproducing apparatus according to an embodiment of the present invention, interfacing the monitor PD signal, the control signals, and the like is made easier by installing the APC apparatus in the optical pickup. Manufacturing cost can thus be reduced by simplifying the configuration of the product.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An optical recording/reproducing apparatus, comprising:
   an optical pickup comprising a laser diode to generate a laser signal recording/reproducing data on/from a data storage medium and which can move across the data storage medium, a monitor to detect an output of the laser diode, and a first printed circuit board including a laser diode driver, with the first printed circuit performing an automatic power control operation by controlling a power level of the laser diode according to changes in temperature of the laser diode, as detected by the monitor and output to the laser diode driver;
   a second printed circuit board, separate from the first printed circuit board, including a controller for controlling the laser diode driver; and
   a flexible printed circuit board to interface signals between the first and second printed circuit boards.

* * * * *

UNITED STATES PATENT AND TRADEMARK OFFICE
CERTIFICATE OF CORRECTION

PATENT NO. : 7,298,766 B2  Page 1 of 1
APPLICATION NO. : 10/320672
DATED : November 20, 2007
INVENTOR(S) : Jin-gyo Seo It is certified that error appears in the above-identified patent and that said Letters Patent is hereby corrected as shown below:

Title Page, Column 2 (Abstract), item [57] Line 12, change "multiflexer." to --multiplexer.--.

Signed and Sealed this

Sixth Day of May, 2008

JON W. DUDAS
*Director of the United States Patent and Trademark Office*